United States Patent
Takenouchi (10) Patent No.: US 6,550,051 B1
(45) Date of Patent: Apr. 15, 2003

(54) LITHOGRAPHIC DATA VERIFICATION METHOD AND PHOTO MASK MANUFACTURING METHOD

(75) Inventor: Ryuji Takenouchi, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/516,184

(22) Filed: Mar. 1, 2000

(30) Foreign Application Priority Data

Feb. 3, 1999 (JP) .......................................... 11-053852

(51) Int. Cl.[7] .......................... G06F 17/50; G06F 19/00
(52) U.S. Cl. .............................. 716/19; 716/21; 716/20; 430/5; 378/35
(58) Field of Search ........................ 716/19, 20, 1–21; 430/5, 30, 22

(56) References Cited

U.S. PATENT DOCUMENTS

| | | | | |
|---|---|---|---|---|
| 6,038,020 A | * | 3/2000 | Tsukuda | 356/237.1 |
| 6,237,133 B1 | * | 5/2001 | Suzuki | 716/19 |
| 6,285,375 B1 | * | 9/2001 | John, Jr. | 345/440 |
| 6,301,698 B1 | * | 10/2001 | Lin et al. | 378/35 |
| 6,314,554 B1 | * | 11/2001 | Takenouchi | 378/35 |
| 6,316,163 B1 | * | 11/2001 | Magoshi et al. | 430/296 |
| 6,353,922 B1 | * | 3/2002 | Dick | 250/491.1 |
| 6,370,679 B1 | * | 4/2002 | Chang et al. | 430/30 |

* cited by examiner

Primary Examiner—Vuthe Siek
Assistant Examiner—Magid Y Dimyan
(74) Attorney, Agent, or Firm—Rader, Fishman & Grauer PLLC; Ronald P. Kananen, Esq.

(57) ABSTRACT

To reduce the time for verification in lithographic data and reduce the turn-around-time in preparation of lithographic data, a first lithographic input data and a second lithographic input data are compared in their data formats to extract data of the first lithographic input data excluding data common to the second lithographic input data as a first difference data, or to extract data of the second lithographic input data excluding data common to the first lithographic input data as a second difference data. If the first difference data and the second difference data contain data, they are compared graphically to extract different data as a third difference data. If the third difference data contains data, the first lithographic input data and the second lithographic input data are acknowledged to have a difference therebetween.

12 Claims, 6 Drawing Sheets

PATTERN CONFIGURATION

DATA FORMAT

Fig. 2B

PATTERN CONFIGURATION

DATA FORMAT

Fig. 3A

PATTERN CONFIGURATION

DATA FORMAT

Fig. 3B

PATTERN CONFIGURATION

DATA FORMAT

LITHOGRAPHIC DATA VERIFICATION METHOD AND PHOTO MASK MANUFACTURING METHOD

FIELD OF THE INVENTION

This invention relates to a method for verifying data of a lithographic apparatus and a method for manufacturing a photo mask, particularly suitable for use in verification of conversion results of data for a lithographic apparatus used for manufacturing a photo mask.

DESCRIPTION OF THE RELATED ART

LSI patterns are increasing in micro-miniaturization and in complexity. Accordingly, data for electron beam lithographic apparatuses made from LSI pattern data are increasing in volume and complexity.

Therefore, verification that a plurality of electron beam lithographic data coincide for the purpose of ensuring accuracy of acquired electron beam lithographic data is generally conducted after making a plurality of electron beam lithographic data from an LSI pattern in a converter apparatus having functions of logical operation and size processing of objects, or in a plurality of data conversion processing systems like conversion software.

Figure 6A:
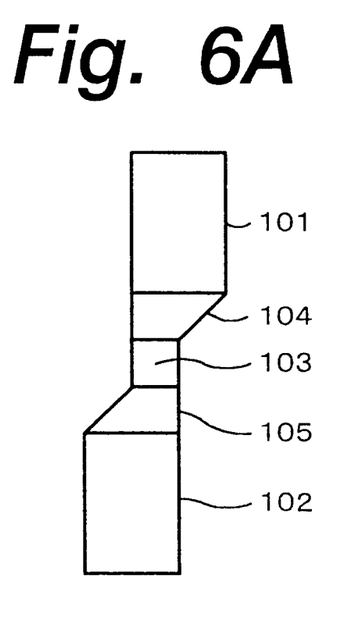
FIGS. 6A and 6B are schematic diagrams showing an example of electron beam lithographic data.
Figure 6B:
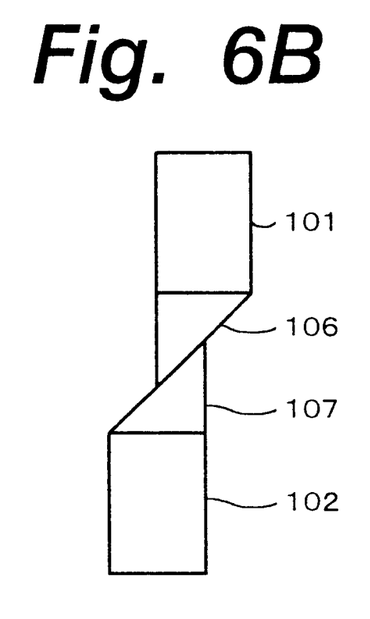

The electron beam lithographic data, in general, are composed of data of rectangular objects 101, 102, 103 and trapezoidal objects 104, 105 as shown in FIG. 6A. However, in data made by a different data conversion processing system, the same data are made up of rectangular objects 101, 102 and triangular objects 106, 107 as shown in FIG. 6B. That is, there might be a difference in the way of dividing an object. Therefore, the aforementioned verification process also employs a process of confirming whether any difference exists or not by conducting graphic exclusive logic sum in a converter apparatus having functions of logical operation and size processing of objects, or in data conversion processing systems like conversion software.

Since graphic logical operation is conducted also for verifying whether two electron beam lithographic data are of the same pattern or not as explained above, it needs an enormous length of processing time as the verification time in addition to the usual conversion time. As a result, it has been a problem that a very long time was required for making electron beam lithographic data and its turn-around-time (TAT) increased.

OBJECTS AND SUMMARY OF THE INVENTION

It is therefore an object of the invention to provide a method for verifying lithographic data and a method for manufacturing a photo mask, which can greatly reduce the verification time to thereby reduce the turn-around-time in preparation of lithographic data and can efficiently manufacture photo masks.

According to the first aspect of the invention, there is provided a method for verifying lithographic data for a lithographic device, characterized in:

comparing a plurality of lithographic data on the basis of data formats thereof; and according to the result of comparison based on the data formats, extracting data from individual lithographic data of the plurality of lithographic data excluding data common to all of the lithographic data as difference data corresponding to individual lithographic data, and graphically comparing respective difference data to conduct verification.

According to the second aspect of the invention, there is provided a method for verifying data for a lithographic device, characterized in:

comparing a first lithographic data and a second lithographic data on the basis of data formats thereof; and according to the result of comparison based on the data formats, extracting data from the first lithographic data in the data format excluding data common to the second lithographic data as a first difference data, and extracting data from the second lithographic data in the data format excluding data common to the first lithographic data as a second difference data, to graphically compare the first difference data and the second difference data to conduct verification.

According to the third aspect of the invention, there is provided a method for manufacturing a photo mask, which makes a photo mask on the basis of lithographic data for a lithographic device, comprising:

comparing a plurality of the lithographic data on the basis of data formats thereof; and according to the result of comparison based on the data formats, extracting data from individual lithographic data of the plurality of lithographic data excluding data common to all of the lithographic data as difference data corresponding to individual lithographic data, and graphically comparing respective difference data to conduct verification.

According to the fourth aspect of the invention, there is provided a method for manufacturing a photo mask, which makes a photo mask on the basis of lithographic data for a lithographic device, comprising:

comparing a first lithographic data and a second lithographic data on the basis of data formats thereof; and according to the result of comparison based on the data formats, extracting data from the first lithographic data in the data format excluding data common to the second lithographic data as a first difference data, and extracting data from the second lithographic data in the data format excluding data common to the first lithographic data as a second difference data, to graphically compare the first difference data and the second difference data to conduct verification.

In the first and third aspects of the invention, verification is typically the verification of whether a plurality of lithographic data are graphically identical data or not.

In the second and fourth aspects of the invention, verification is typically the verification of whether a first lithographic data and a second lithographic data are graphically identical data or not.

In the second and fourth aspects of the invention, verification is preferably conducted by graphically comparing a first difference data and a second difference data, thereby extracting the part not common to the first and second difference data as a third difference data, and verifying whether the third difference data contains any data. In the case where the second lithographic data is corrected one of the first lithographic data obtained by operation processing of the first lithographic data, a fourth difference data is made by operating the third difference data by the opposite operation processing from that of the first lithographic data after extracting the third difference data. Then, it is verified whether the fourth difference data contains any data or not. If the fourth difference data contains any data, correction of the first lithographic data is judged to be abnormal. If it does not contain any data, correction of the first lithographic data is judged to be normal.

In the second and fourth aspects of the invention, for the purpose of minimizing the time required for verifying whether the first lithographic data and the second lithographic data are identical or not, preferably when the first difference data and the second difference data contain no data, the first lithographic data and the second lithographic data are judged to be graphically identical.

In the second and fourth aspects of the invention, for the purpose of minimizing the time required for verifying whether the first lithographic data and the second lithographic data are identical or not, preferably when the first difference data contains data whereas the second difference data contains no data, the first lithographic data is determined to be different in the first difference data.

In the second and fourth aspects of the invention, for the purpose of minimizing the time required for verifying whether the first lithographic data and the second lithographic data are identical or not, preferably when the second difference data contains data whereas the first difference data contains no data, the second lithographic data is determined to be different in the second difference data.

In the second and fourth aspects of the invention, preferably when the third difference data contains no data, the first lithographic data and the second lithographic data are determined to be graphically identical, and when the third difference data contains any data, the first lithographic data and the second lithographic data are determined to be graphically different in the third difference data.

According to the lithographic data verification method and the photo mask manufacturing method having the above-summarized structure proposed by the present invention, by comparing a plurality of lithographic data with reference to a data format, thereby extracting from each lithographic data the part excluding that common to all of the lithographic data as a difference data in each lithographic data, and then comparing and verifying respective difference data, it is possible to limit graphic operation processing to the only lithographic data different in the data format and thereby largely reduce the amount of data to be graphically operated.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Explained below are embodiments of the invention with reference to the drawings. In all of the drawings illustrating the embodiments, common and equivalent parts or components are labeled with common reference numerals.

Figure 1:
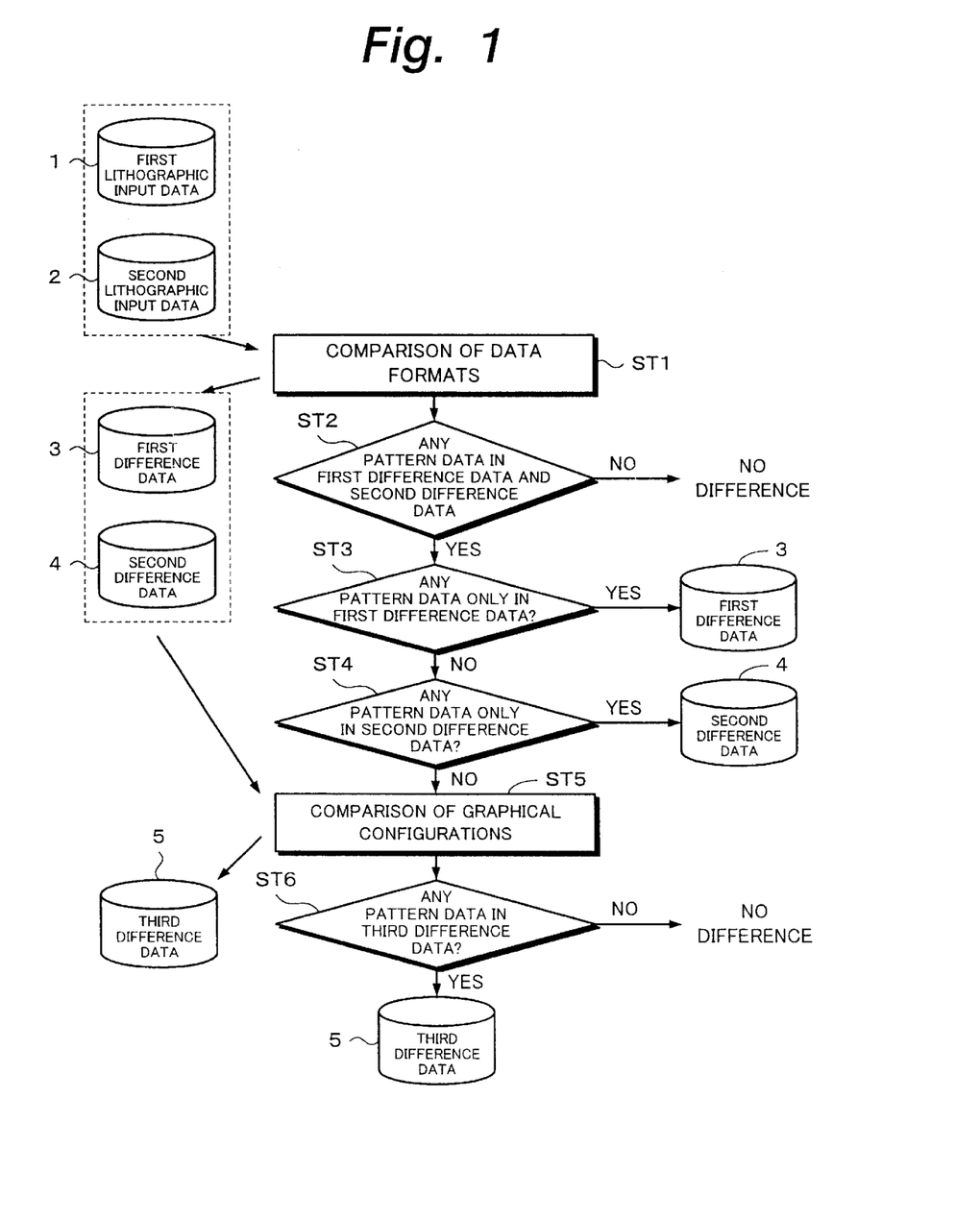
FIG. 1 is a flow chart for explaining a method for verifying lithographic data according to the first embodiment of the invention.
Figure 2A:
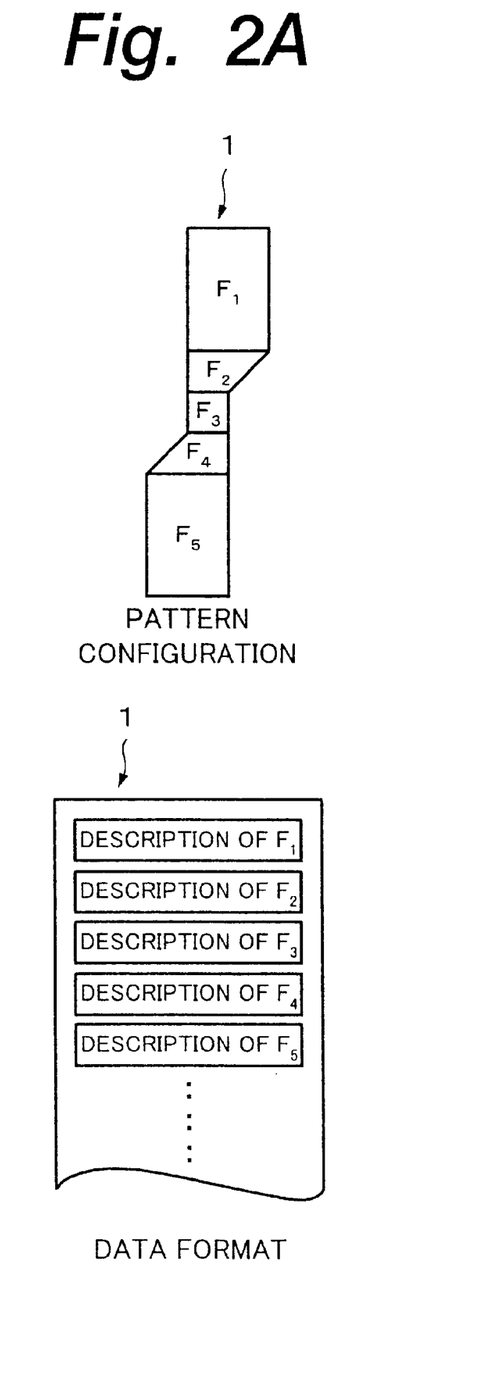
FIGS. 2A and 2B are schematic diagrams showing an example of lithographic apparatus input data to be verified by the lithographic data verification method according to the first embodiment.
Figure 2B:
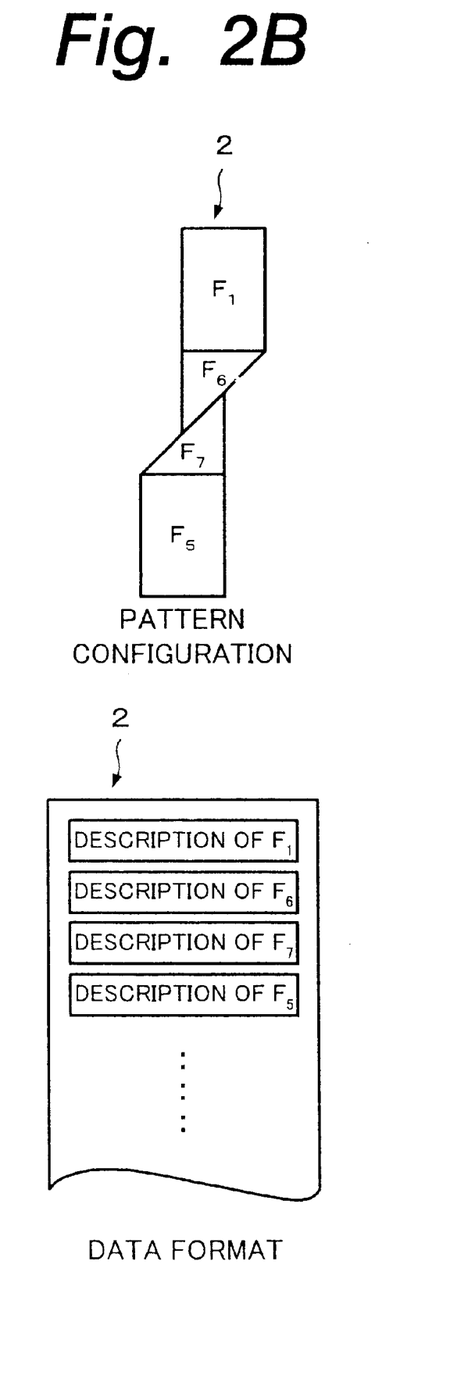

First explained is a method for verifying electron beam lithographic data according to the first embodiment of the invention. The first embodiment is explained verifying whether any difference exists or not between two electron beam lithographic data processed by two different data converters. FIG. 1 shows a flow chart of the verification method according to the first embodiment, and FIGS. 2A and 2B show examples of lithographic input data of electron beam lithographic data.

As shown in FIG. 1, in the first embodiment, a first lithographic input data 1 and a second lithographic input data 2 after conversion processing by two different data converters are input, and pattern data are read out. Assume here, as shown in FIG. 2A, that the pattern configuration of the first lithographic input data 1 is made up of an object F1 object F2, object F3, object F4 and object F5, and its data format includes a description of the object F1, description of the object F2, description of the object F3, description of the object F4 and description of the object F5. Similarly assume, as shown in FIG. 2B, that the pattern configuration of the second lithographic data 2 is made up of the object F1, object F6, object F7 and object F5, and its data format is made up of a description of the object F1, description of the object F6, description of the object F7 and description of the object F5. Descriptions of objects include information about coordinates, width, height, and so forth, of the objects.

Figure 3A:
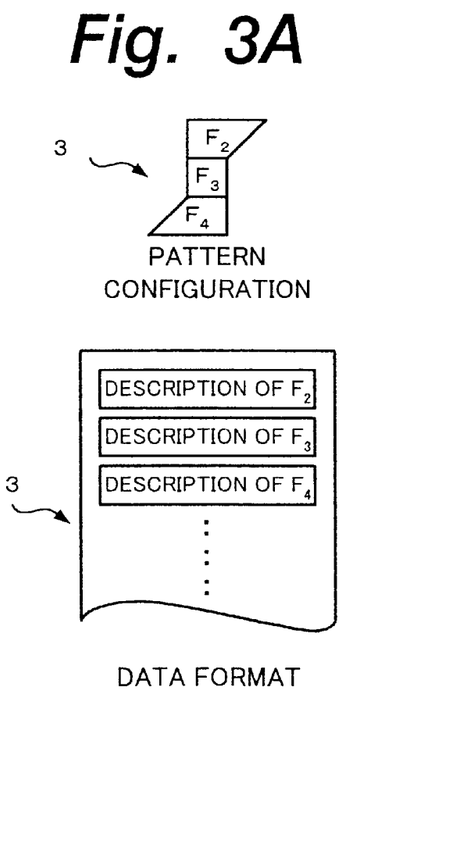
FIGS. 3A and 3B are schematic diagrams showing an example of difference data in the first embodiment of the invention.
Figure 3B:
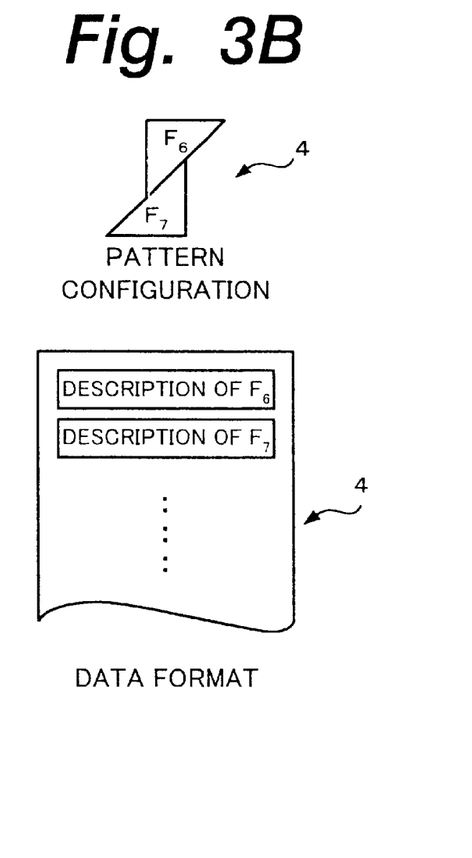

As shown in FIG. 1, in step ST1, the first lithographic input data 1 and the second lithographic input data 2 are compared in their data formats. In this comparison process, parts of pattern descriptions common to the first lithographic input data and the second lithographic input data are detected, and parts of pattern descriptions different between them are extracted. Thereby, the different part of the first lithographic input data is extracted as a first difference data 3, and the different part of the second lithographic input data is extracted as a second difference data 4. In this first embodiment, as shown in FIG. 2A and FIG. 2B, by comparison of their data formats, the description of the object F1 and the description of the object F5 are acknowledged to be common in the first lithographic input data 1 and the second lithographic input data 2, and the remainder descriptions other than the description of the object F1 and the description of the object F5, namely, description of the object F2, description of the object F3 and description of the object F4 in the first lithographic input data 1, and description of the object F6 and description of the object F7 are acknowledged to be different. As a result, in the comparison step in step ST1, the description of the object F2, description of the object F3 and description of the object F4 in the first lithographic input data 1 are extracted as the first difference data 3 as shown in FIG. 3A, and the description of the object F6 and description of the object F7 in the second lithographic input data 2 are extracted as the second difference data 4 as shown in FIG. 3B.

Still referring to FIG. 1, next in step ST2, it is judged whether both of the first difference data 3 and the second difference data 4 contain pattern data, respectively. If the result of this judgment indicates that none of the difference data 3 and the difference data 4 contain any pattern data, it is judged that no difference in data format exists between the lithographic input data 1 and the lithographic input data 2, and the verification is finished. In the first embodiment, since the first difference data 3 includes pattern data of the objects F2, F3 and F4, and the second difference data 4 includes pattern data of the objects F6 and F7, it moves to the next step ST3.

In step ST3, it is judged whether one of the difference data, i.e. the second difference data 4, does not include pattern data, and only the other, i.e. the first difference data 3, includes pattern data or not. If the result of this judgment shows that only the first difference data 3 includes pattern data, the first difference data 3 is extracted as being the different part of the first difference data, and the verification is finished. In the first embodiment, since both the first difference data 3 and the second difference data 4 include pattern data, it moves to the next step ST4.

In step ST4, it is judged whether the first difference data 3 does not include pattern data but the second difference data 4 includes pattern data or not. If the result of the judgment demonstrates that only the second difference data includes pattern data, the second difference data 4 is extracted as being the different part of the second lithographic input data 2, and the verification is finished. In the first embodiment, since both the first difference data 3 and the second difference data 4 include pattern data, it moves to the next step ST5.

In step ST5, the pattern data contained in both the first difference data 3 and second difference data 4 undergo graphic exclusive logic sum operation. As a result, different parts between the first difference data 3 and the second difference data 4 are output as a third difference data 5. Then the process moves to step ST6.

In step ST6, it is judged whether the third difference data 5 contains pattern data or not. If the third difference data 5 does not contain pattern data, the first lithographic input data 1 and the second lithographic input data 2 are determined to have no difference therebetween, and the verification is finished.

If the third difference data 5 contains pattern data, the first lithographic input data 1 and the second lithographic data 2 are determined to have a difference therebetween, and the third difference data 5 is output. Here the verification is finished. After that, the parts of the first lithographic input data 1 and the second lithographic input data 2 which correspond to the third difference data 5 are corrected, and a desired lithographic input data is prepared.

After that, this lithographic data is supplied to a lithographic device such as electron beam lithographic apparatus. Then, by a known technique, a photo mask having a pattern based on the desired lithographic input data obtained is manufactured.

As explained above, according to the first embodiment, since the first lithographic input data 1 and the second lithographic input data 2 converted by two different data converters are compared in their data formats to thereby extract the parts excluding the common parts of the first lithographic input data 1 and the second lithographic input data 2 as the first difference data 3 and the second difference data 4 so as to execute graphic logical operation processing of the first difference data 3 and the second difference data 4 only when the first difference data 3 and the second difference data 4 both include pattern data, it is possible to conduct graphic logical operation processing requiring much time only on the minimum data by excluding the common parts of the first lithographic input data and the second lithographic input data in the process of comparison in data formats which does not require much time, and thereby possible to largely reduce the time required for verification. Therefore, it is possible to prevent an increase of the turn-around-time during preparation of electron beam lithographic data such as first lithographic data 1 and second lithographic input data 2, and also possible to greatly reduce the time required for manufacturing and developing photo masks. Additionally, when only one of the first difference data 3 and the second difference data 4 includes pattern data, graphic logic operation processing need not be conducted, and the time for verification can be reduced further.

Furthermore, in the first embodiment, even when these two, i.e. the first lithographic input data 1 and the second lithographic input data 2 have different formats, the same effect can be obtained by conducting the same processing as the above-explained processing after converting the first lithographic input data 1 and the second lithographic input data 2 into an appropriate common format.

Figure 4:
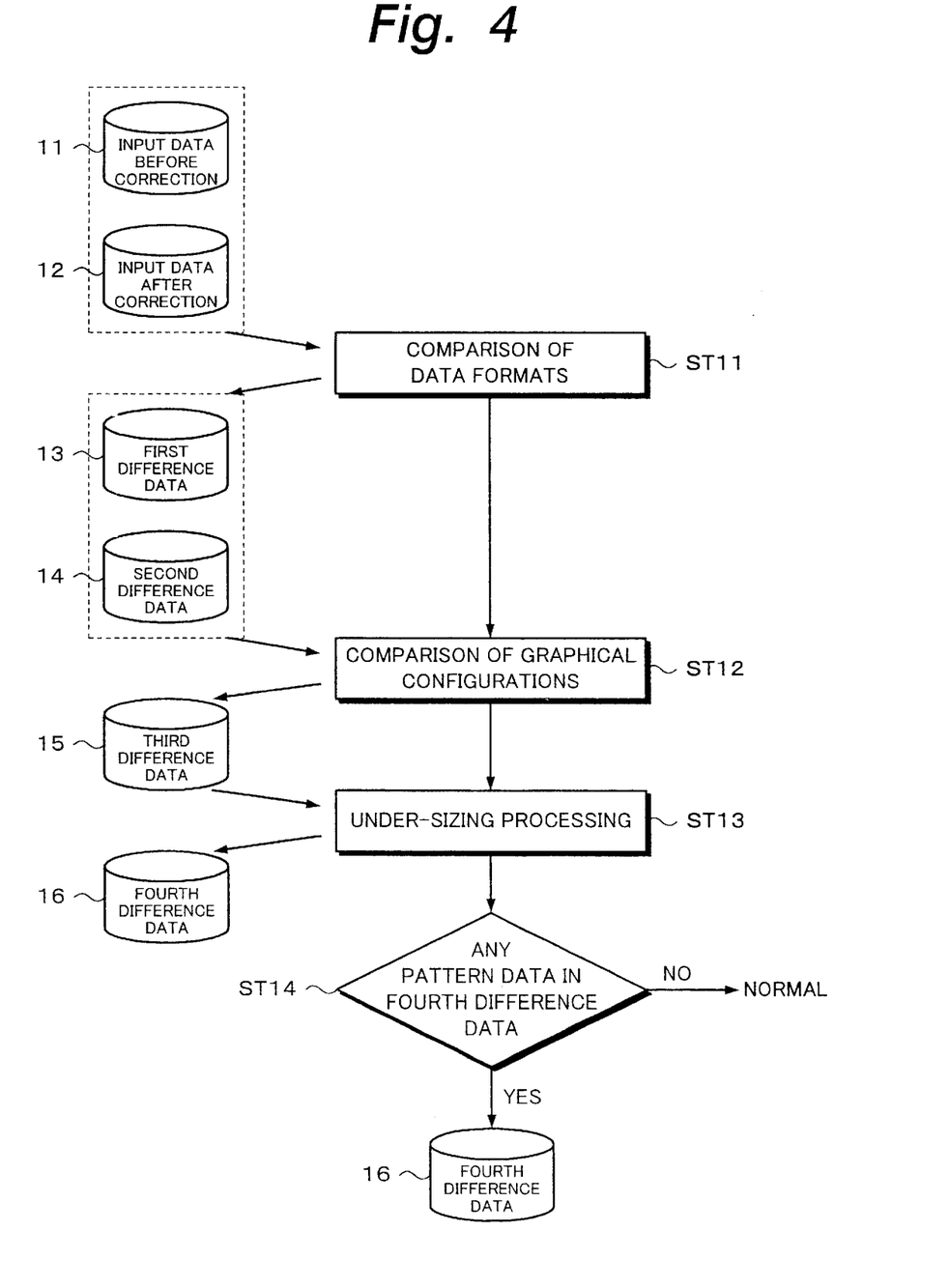
FIG. 4 is a flow chart for explaining a method for verifying lithographic data according to the second embodiment of the invention.
Figure 5A:
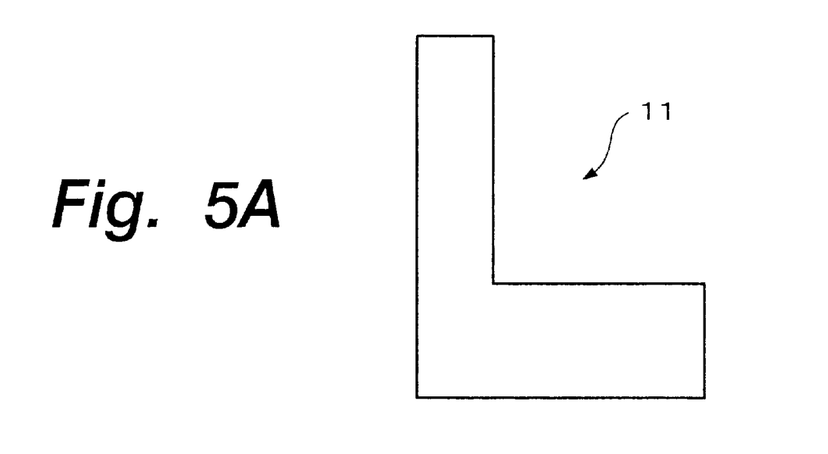
FIGS. 5A, 5B and 5C are schematic diagrams showing a pattern undergoing optical proximity effect correction according to the second embodiment of the invention.
Figure 5B:
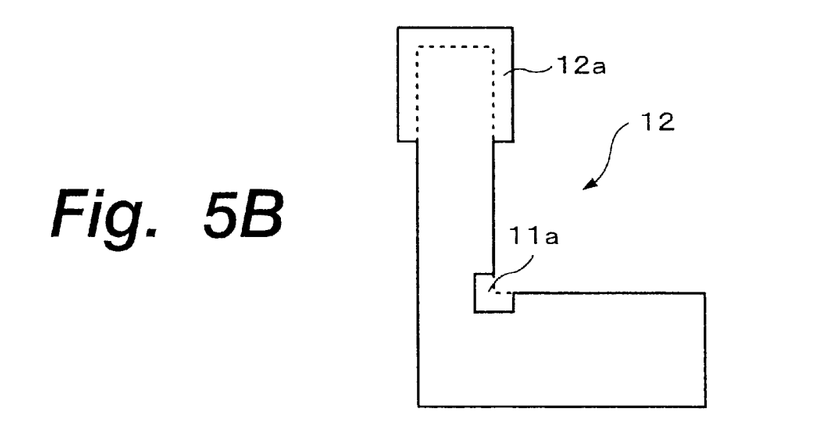
Figure 5C:
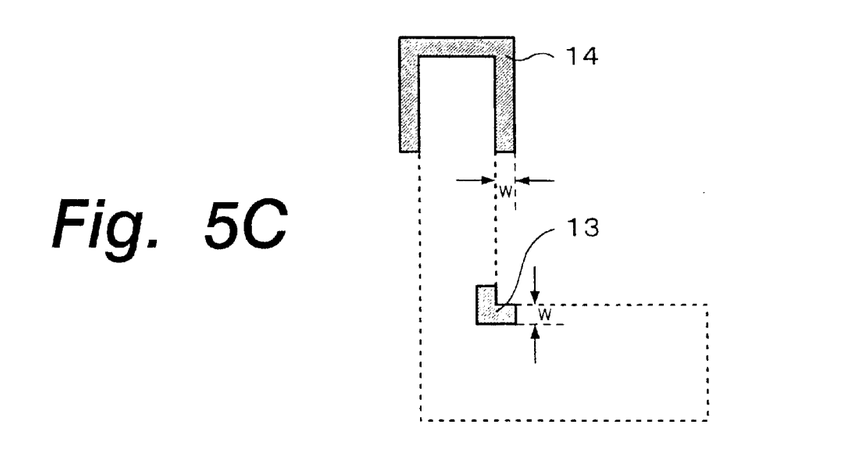

Next explained is a method for verifying electron beam lithographic data according to the second embodiment of the invention. The second embodiment is directed to verifying whether optical proximity effect correction occurring upon transfer of a design rule pattern near the exposure wavelength was properly done or not. FIG. 4 shows a flow chart of the verification method according to the second embodiment, and FIG. 5 shows an example of lithographic input data before and after the optical proximity effect correction.

As shown in FIG. 4, in the second embodiment, first of all, lithographic input data 11 before proximity effect correction (see FIG. 5A) and lithographic input data 12 after proximity effect correction (see FIG. 5B) are input, and pattern data are read out.

Next as shown in FIG. 4, in step ST11, these lithographic input data 11 before correction and lithographic input data 12 after correction are compared in their data formats in the same manner as the first embodiment. In this comparison process, common pattern descriptive portions in the lithographic input data 11 before correction and the lithographic input data 12 after correction are detected and deleted, and different pattern descriptive portions are extracted. In the second embodiment, the lithographic input data 11 before correction shown in FIG. 5A and the lithographic input data 12 after correction shown in FIG. 5B are common in the dotted portion, but different in the cross-hatched portion as shown in FIG. 5C. Therefore, as shown in FIG. 5A and FIG. 5B, in step ST11, the corrected pattern portion 11a deleted by correction from the lithographic input data 11 before correction is output as a first difference data 13, and the corrected pattern portion 12a in the lithographic input data 12 after correction, which was added by correction, is output as a second difference data 14. Usually, the lithographic input data before correction is modified in the corrected pattern portion from the lithographic input data before correction, and the pattern data of the portion not requiring correction is maintained in the original description. As a result, the first difference data 13 and the second difference data 14 include only the amended portions, respectively, and it results in extracting only the minimum data of the portion necessary for verification. After that, it moves to step ST12 shown in FIG. 4.

In the next step ST12, graphic exclusive logic sum operation is conducted to the first difference data 13 and the second difference data 14. As a result, data not common to the first difference data 13 and the second difference data 14 are extracted and output as a third difference data 13. In the second embodiment, since the first difference data 13 and the second difference data 14 do not overlap in any portion, the third difference data 15 includes the first difference data 13 and the second difference data 14 in their original forms. After that, it moves to step ST13.

In the next step ST13, the third difference data 14 undergoes the processing opposite from the above-mentioned optical proximity effect correction. In the second embodiment, the third difference data 15 is processed to return the lithographic input data 12 after correction shown in FIG. 5B to the lithographic input data before correction shown in FIG. 5A, only a predetermined width w shown in FIG. 5C undergoes under-sizing processing. Then, the result of the under-sizing processing of the third difference data 15 is output as the fourth difference data 16, and the process moves to step ST14.

If no pattern data is contained in the fourth difference data 16, the correction is considered to be normal, and verification is finished. After that, the lithographic input data 12 after correction is supplied to a lithographic device like electron beam lithographic apparatus, and a photo mask having a pattern based on the lithographic input data 12 is manufactured by a known technique.

If the fourth difference data 16 contains pattern data, correction is judged to be abnormal, and the pattern data of the fourth difference data 16 then output is detected as a correction error. When the correction error is detected, desired lithographic input data is prepared by correcting the portion of the fourth difference data 16 of the lithographic input data 12 after correction by a predetermined process.

After that, the lithographic input data after correction is supplied to a lithographic device like electron beam lithographic apparatus, and a photo mask having a pattern based on the desired lithographic input data is manufactured by a known technique.

As explained above, according to the second embodiment, since the lithographic input data 11 before correction and the lithographic input data 12 after correction are compared in their data formats to thereby output the parts not common to these both data as the first difference data 13 and the second difference data 14, respectively, so as to execute graphic logical operation processing (step ST12) of the first difference data 13 and the second difference data 14, it is possible to conduct graphic logical operation processing requiring much time only on the minimum data of the corrected portion by excluding the common parts in the process of comparison (step ST11) in data formats which does not require much time, and thereby possible to obtain the same effects as those of the first embodiment.

For example, pattern configurations and data formats of the lithographic input data shown in the embodiments are not but examples, and any other pattern configurations and data formats may be used if so desired.

As described above, according to the invention, since a plurality of lithographic data are compared in their data formats to thereby extract data excluding those common to all lithographic data from respective lithographic data as their difference data, respectively, so as to execute graphic logical operation processing of individual difference data to graphically compare and verify the respective difference data, so that graphic logical operation requiring much processing time can be limited only to the different portions, it is possible to largely reduce the time required for verification of lithographic data and reduce the turn-around-time in the process of preparing the lithographic data.

Having described specific preferred embodiments of the present invention with reference to the accompanying drawings, it is to be understood that the invention is not limited to that precise embodiment, and that various changes and modifications may be effected therein by one skilled in the art without departing from the scope or the spirit of the invention as defined in the appended claims.

What is claimed is:

1. A method for verifying lithographic data for a lithographic device, characterized in:
   comparing a plurality of lithographic data on the basis of data formats thereof; and
   according to the result of comparison based on the data formats, extracting data from individual lithographic data of said plurality of lithographic data excluding data common to all of the lithographic data as difference data corresponding to individual said lithographic data, and graphically comparing respective said difference data to conduct verification.

2. The method for verifying lithographic data according to claim 1 wherein said verification determines whether said plurality of lithographic data are graphically identical data or not.

3. A method for verifying data for a lithographic device, characterized in:
   comparing a first lithographic data and a second lithographic data on the basis of data formats thereof; and
   according to the result of comparison based on the data formats, extracting data from said first lithographic data in said data format excluding data common to said second lithographic data as a first difference data, and extracting data from said second lithographic data in said data format excluding data common to said first lithographic data as a second difference data, to graphically compare said first difference data and said second difference data to conduct verification.

4. The method for verifying lithographic data according to claim 3 wherein said verification determines whether said first lithographic data and said second lithographic data are graphically identical or not.

5. The method for verifying lithographic data according to claim 3 wherein, by graphically comparing said first difference data and said second difference data, data included in said first difference data and said second difference data but not common to both these difference data are extracted as a third difference data, and verification is conducted to confirm whether any data is contained in said third difference data.

6. The method for verifying lithographic data according to claim 5 wherein said second lithographic data is corrected one of said first lithographic data by operation processing of said first lithographic data, and a fourth difference data is prepared by conducting operation processing opposite from said operation processing executed to said third difference data after extracting said third difference data.

7. A method for manufacturing a photo mask, which makes a photo mask on the basis of lithographic data for a lithographic device, comprising:
   comparing a plurality of said lithographic data on the basis of data formats thereof; and
   according to the result of comparison based on the data formats, extracting data from individual lithographic data of said plurality of lithographic data excluding data common to all of the lithographic data as difference data corresponding to individual said lithographic data, and graphically comparing respective said difference data to conduct verification.

8. The method for manufacturing a photo mask according to claim 7 wherein said verification confirms whether said plurality of lithographic data are graphically identical or not.

9. A method for manufacturing a photo mask, which makes a photo mask on the basis of lithographic data for a lithographic device, comprising:

comparing a first lithographic data and a second lithographic data on the basis of data formats thereof; and according to the result of comparison based on the data formats, extracting data from said first lithographic data in said data format excluding data common to said second lithographic data as a first difference data, and extracting data from said second lithographic data in said data format excluding data common to said first lithographic data as a second difference data, to graphically compare said first difference data and said second difference data to conduct verification.

10. The method for manufacturing a photo mask according to claim 9 wherein said verification confirms whether said first lithographic data and said second lithographic data are graphically identical or not.

11. The method for manufacturing a photo mask according to claim 9 wherein data contained in said first difference data but not common to said second difference data is extracted as a third difference data by graphically comparing said first difference data and said second difference data, and verification is conducted to confirm whether said third difference data contains data.

12. The method for manufacturing a photo mask according to claim 11 wherein said second lithographic data is corrected one of said first lithographic data by operation processing of said first lithographic data, and a fourth difference data is prepared by conducting operation processing opposite from said operation processing executed to said third difference data after extracting said third difference data.

* * * * *